United States Patent
Yotsuji

(10) Patent No.: US 7,915,943 B2
(45) Date of Patent: Mar. 29, 2011

(54) MIXER CIRCUIT

(75) Inventor: Tetsuaki Yotsuji, Ukyo-Ku (JP)

(73) Assignee: Rohm Co., Ltd. (JP)

( * ) Notice: Subject to any disclaimer, the term of this patent is extended or adjusted under 35 U.S.C. 154(b) by 65 days.

(21) Appl. No.: 12/522,647

(22) PCT Filed: Jan. 9, 2008

(86) PCT No.: PCT/JP2008/000007
§ 371 (c)(1),
(2), (4) Date: Jul. 9, 2009

(87) PCT Pub. No.: WO2008/084760
PCT Pub. Date: Jul. 17, 2008

(65) Prior Publication Data
US 2010/0085104 A1 Apr. 8, 2010

(30) Foreign Application Priority Data
Jan. 12, 2007 (JP) .................... 2007-004702

(51) Int. Cl.
G06F 7/44 (2006.01)
G06F 7/16 (2006.01)

(52) U.S. Cl. .......................... 327/356; 327/359

(58) Field of Classification Search .............. None
See application file for complete search history.

(56) References Cited

U.S. PATENT DOCUMENTS

| | | | | |
|---|---|---|---|---|
| 6,212,369 B1 * | 4/2001 | Avasarala | ..................... | 455/333 |
| 6,308,058 B1 * | 10/2001 | Souetinov et al. | ............ | 455/326 |
| 6,329,864 B2 * | 12/2001 | Suematsu et al. | ............. | 327/356 |
| 6,653,885 B2 * | 11/2003 | Wu et al. | ....................... | 327/356 |
| 7,242,236 B2 * | 7/2007 | Krug et al. | .................... | 327/356 |

FOREIGN PATENT DOCUMENTS

| JP | 11-17455 A | 1/1999 |
|---|---|---|
| JP | 2003-318674 A | 11/2003 |
| JP | 2004-96644 A | 3/2004 |

OTHER PUBLICATIONS

International Preliminary Report on Patentability for International Application No. PCT/JP2008/000007 issued Jul. 14, 2009 with English translation.
International Search Report for International Application No. PCT/JP2008/000007 issued Apr. 8, 2008 with English translation.

* cited by examiner

*Primary Examiner* — Tuan Lam
(74) *Attorney, Agent, or Firm* — Cantor Colburn LLP

(57) ABSTRACT

Regarding N-channel first transistor and a P-channel second transistor, their first terminals are connected to each other and their second terminals are connected to each other. Regarding third transistor and a fourth transistor, their first terminals are also connected to each other and their second terminals are also connected to each other. For the first transistor through the fourth transistor, a first capacitor through a fourth capacitor used for coupling are provided. A first impedance element through a fourth impedance element are provided in a path where a bias voltage is applied to the first transistor through the fourth transistor. A fifth capacitor is provided between the first terminals of the first-fourth transistors and a first input terminal. A fifth impedance element and a sixth impedance element are provided as differential pair loads.

4 Claims, 3 Drawing Sheets

RELATED ART

MIXER CIRCUIT

CROSS REFERENCE TO RELATED APPLICATIONS

This is a U.S. national stage of application No. PCT/JP2008/000007, filed on 9 Jan. 2008. Priority under 35 U.S.C. §119(a) and 35 U.S.C. §365(b) is claimed from Japanese Application No. 2007-004702, filed 12 Jan. 2007, the disclosure of which is also incorporated herein by reference.

BACKGROUND OF THE INVENTION

1. Field of the Invention

The present invention relates to a mixer circuit, and particularly to a single-balanced mixer.

2. Description of the Related Art

In wired or wireless communication, a mixer circuit is used for up-conversion where a carrier is modulated by using a modulating signal and for down-conversion where the frequency of a modulated carrier is converted into a low-frequency band. A Gilbert-cell type single-balanced mixer is widely used as a mixer circuit.

A Gilbert-cell mixer is provided with a constant electric current circuit, a transistor to which a first signal is input, a transistor to which a second signal is input, and an impedance circuit, all stacked between a ground terminal and a power supply voltage terminal.

[Patent document 1] Japanese Patent Application (Laid-Open) No. 2003-318674

In recent years, with the miniaturization of the semiconductor process, reduction of operating voltage for a circuit is progressing. In this instance, the use of a conventional Gilbert-cell mixer creates the problem of producing a distorted output signal due to the saturation of transistors that are stacked in multi-levels.

SUMMARY OF THE INVENTION

In this background, a purpose of the present invention is to provide a mixer circuit that can operate with a low-voltage power supply.

A mixer circuit of an embodiment of the present invention multiplies, upon the receipt of a single-ended first signal input to a first input terminal and a second signal pair input differentially to two second input terminals, the first signal and the second signal pair and then outputs differentially from two output terminals. The mixer circuit comprises: an N-channel first MOSFET (Metal Oxide Semiconductor Field Effect Transistor) and a P-channel second MOSFET where their first terminals are connected to each other and their second terminals are connected to each other; an N-channel third MOSFET and a P-channel fourth MOSFET where their first terminals are connected to each other and their second terminals are connected to each other; a first capacitor provided between a gate of the first MOSFET and one of the second input terminals; a second capacitor provided between a gate of the second MOSFET and the other one of the second input terminals; a third capacitor provided between a gate of the third MOSFET and the other one of the second input terminals; a fourth capacitor provided between a gate of the fourth MOSFET and said one of the second input terminals; a first impedance element, whose one end is connected to the gate of the first MOSFET, that receives a first voltage at the other end; a second impedance element, whose one end is connected to the gate of the second MOSFET, that receives a second voltage at the other end; a third impedance element, whose one end is connected to the gate of the third MOSFET, that receives a first voltage at the other end; a fourth impedance element, whose one end is connected to the gate of the fourth MOSFET, that receives a second voltage at the other end; a fifth capacitor provided between the first terminals of the first, second, third, and fourth MOSFETs and the first input terminal; a fifth impedance element, whose one end is connected to the second terminals of the first and second MOSFETs, that receives a third voltage at the other end; and a sixth impedance element, whose one end is connected to the second terminals of the third and fourth MOSFETs, that receives a third voltage at the other end. The second terminals of the first and second MOSFETs are one of the output terminals and the second terminals of the third and fourth MOSFETs are the other one of the output terminals.

The first and second terminals of a transistor are specified as terminals that form a channel, and they correspond to either a drain or a source. According to the present embodiment, the fifth impedance element (or the sixth impedance element), a pair of the first and second MOSFETs (or the third and fourth MOSFETs), and the fifth capacitor are all stacked between the third voltage and a first input terminal. Therefore, since an active element is only for one level, the third voltage can be set lower compared to the conventional power supply voltage enabling the operation at low voltage.

The mixer circuit of an embodiment may further comprise a sixth capacitor provided between one of the output terminals and a ground terminal, and the seventh capacitor is provided between the other output terminals and a ground terminal.

Providing the sixth capacitor and the seventh capacitor can improve the isolation and enable the capacitors to function as loads similarly to the sixth impedance element Z6 and the seventh impedance element Z7.

The mixer circuit of an embodiment may further comprise an eighth capacitor provided between two output terminals.

Providing the eighth capacitor can improve the isolation and can suppress the leakage of a signal from the second input terminal to the output terminal.

The mixer circuit may be formed by using a silicon CMOS process. This can lower the manufacturing cost.

An embodiment of the present invention is an electronic apparatus. The electronic apparatus is provided with a frequency converter that generates a sum-frequency signal or a difference-frequency signal of a first signal with a first frequency and a second signal with a second frequency. The frequency converter includes the above-mentioned mixer circuit that mixes the first signal and the second signal.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings that are meant to be exemplary not limiting, and wherein like elements are numbered alike in several figures, in which.

DETAILED DESCRIPTION OF THE INVENTION

The invention will now be described based on preferred embodiments, which do not intend to limit the scope of the present invention but exemplify the invention. All of the features and the combinations thereof described in the embodiment are not necessarily essential to the invention.

In the specification, the condition where "a member A and a member B are connected" includes the case where the member A and the member B are physically connected and the case where the member A and the member B are connected indirectly via another member that does not affect their electrical connection.

Similarly, the "condition where a member C is provided between a member A and a member B" includes, in addition to the case where the member A and the member C or the member B and the member C are directly connected, the case where they are indirectly connected via another member that does not affect their electrical connection.

Figure 1:
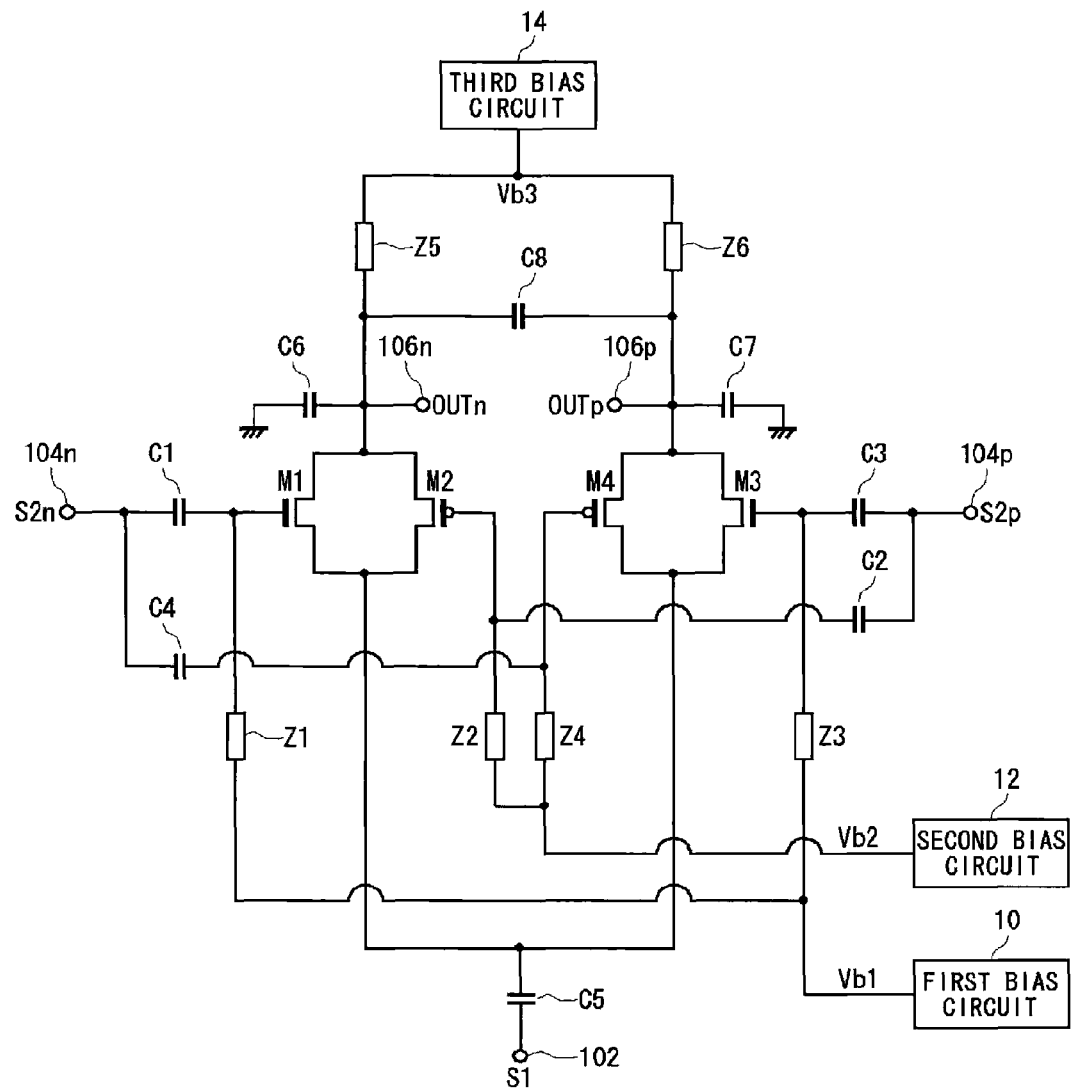
FIG. 1 is a circuit diagram showing the configuration of a mixer circuit according to the embodiment of the present invention.

FIG. 1 is a circuit diagram showing the configuration of a mixer circuit 100 according to the embodiment of the present invention. The mixer circuit 100 is provided with first through fourth transistors M1-M4, first through eighth capacitors C1-C8, first through sixth impedance elements Z1-Z6, a first bias circuit 10, a second bias circuit 12, and a third bias circuit 14. The mixer circuit 100 can be constituted by using a silicon CMOS (Complementary Metal Oxide Semiconductor) process.

The mixer circuit 100 receives both a single-ended first signal S1 input to a first input terminal 102 and a pair of second signals S2n and S2p input differentially to two second input terminals 104n and 104p. The mixer circuit 100 multiplies the first signal S1 and a second signal pair S2 and then outputs differential signals OUTp and OUTn from the two output terminals 106n and 106p.

The first transistor M1 and the second transistor M2 are an N-channel MOSFET and a P-channel MOSFET, respectively, and a first transistor pair is constituted by their first terminals connected to each other and their second terminals connected to each other. Similarly, the third transistor M3 and the fourth transistor M4 are an N-channel MOSFET and a P-channel MOSFET, respectively, and a second transistor pair is constituted by their first terminals connected to each other and their second terminals connected to each other.

Seen from another viewpoint, the first transistor M1 and the third transistor M3, which are N-channel MOSFETs, form a differential pair with the fifth impedance element Z5 and the sixth impedance element Z6 as loads. Similarly, the second transistor M2 and the fourth transistor M4, which are P-channel MOSFETs, form a differential pair with the fifth impedance element Z5 and the sixth impedance element Z6 as loads. The second signals S2n and S2p, which vary in a complementary style, are input to a gate of transistors having the same conductivity, which form a differential pair.

Preferably, the first transistor M1 and the third transistor M3, which constitute a differential pair, are formed by being paired together, and the second transistor M2 and the fourth transistor M4 are formed similarly by being paired together. Pairing can further reduce a feed-through, which will be described hereinafter. Using the mixer circuit 100 as a receiving mixer of a direct conversion format can reduce the offset that appears in a low-frequency band resulting from a pair mismatch.

The impedances of the fifth impedance element Z5 and the sixth impedance element Z6 are set to be equal. The value of the impedances is set so that the frequency bands of output signals OUTn and OUTp after frequency conversion do not appear on the side of the third bias circuit 14.

The first capacitor C1 through the fourth capacitor C4 are DC(direct current)-block coupling capacitors, and their capacitance values are set to be equal.

The first capacitor C1 is provided between a gate of the first transistor M1 and the second input terminal 104n of the set of the second input terminals. The second capacitor C2 is provided between a gate of the second transistor M2 and the second input terminal 104p of the set of the second input terminals.

The third capacitor C3 is provided between a gate of the third transistor M3 and the second input terminal 104p of the set of the second input terminals. The fourth capacitor C4 is provided between a gate of the fourth transistor M4 and the second input terminals 104n of the set of the second input terminals.

The first bias circuit 10, the second bias circuit 12, and the third bias circuit 14 generate a first bias voltage Vb1, a second bias voltage Vb2, and a third bias voltage Vb3, respectively.

The first bias voltage Vb1 is a voltage that sets a DC bias point of the gates of the first transistor M1 and the third transistor M3, which are N-channel MOSFETs. The second bias voltage Vb2 is a voltage that sets a DC bias point of the gates of the second transistor M2 and the fourth transistor M4, which are P-channel MOSFETs. The third bias voltage Vb3 is a voltage that sets a DC bias point of the drains or sources of the first through fourth transistors M1-M4.

With reference to the third bias voltage Vb3, the first bias voltage Vb1 and the second bias voltage Vb2 are set to be close to the values as follows.

$$Vb1 = Vb3 + Vtn$$

Vb2=Vb3−Vtp Vt(n) and Vt(p) are gate-source threshold voltages of N-channel and P-channel MOSFETs. The third bias voltage Vb3 may be set to be about one half of a power supply voltage Vdd. For example, when Vdd=1.2V and Vtn=Vtp=0.5V, the voltages are set to be about Vb1=1.1V, Vb2=0.1V, and Vb3=0.6V.

The bias voltages Vb1-Vb3 may be generated by dividing the power supply voltage Vdd according to the resistances and/or may be generated by using a circuit, for example, a regulator.

The first through sixth impedance elements Z1-Z6 are constituted by any one of resistances or inductances or by the combination thereof.

In reference to the first impedance element Z1, one end thereof is connected to the gate of the first transistor M1, and the first bias voltage Vb1 is applied to the other end. In reference to the second impedance element Z2, one end thereof is connected to the gate of the second transistor M2, and the second bias voltage Vb2 is applied to the other end.

In reference to the third impedance element Z3, one end is connected to the gate of the third transistor M3, and the first bias voltage Vb1 is applied to the other end. In the case of the fourth impedance element Z4, one end is connected to the gate of the fourth transistor M4, and the second bias voltage Vb2 is applied to the other end.

The values of the first impedance element Z1 through the fourth impedance element Z4 are set to be equal to one another. The value of impedance is set to a high value so that the second signals S2n and S2p that leak via the first transistor M1 through the fourth transistor M4 do not get mixed into the first bias circuit 10 and the second bias circuit 12.

The first terminals of the first through fourth transistors M1-M4 are commonly connected to one another. A fifth capacitor C5 is provided between the commonly connected first terminals of the first through fourth transistors M1-M4 and the first input terminal 102.

In reference to the fifth impedance element Z5, one end thereof is connected to the commonly-connected second terminals of the first transistor M1 and the second transistor M2, and the third bias voltage Vb3 is applied to the other end.

In reference to the sixth impedance element Z6, one end thereof is connected to the commonly-connected second terminals of the third transistor M3 and the fourth transistor M4, and the third bias voltage Vb3 is applied to the other end.

The second terminals of the first transistor M1 and the second transistor M2 are connected to one of the output terminals 106n, and the second terminals of the third transistor M3 and the fourth transistor M4 are connected to the other output terminal 106p.

In order to improve the properties of the circuit, sixth capacitor C6 through eighth capacitors C8 may be arbitrary added.

The sixth capacitor C6 is provided between one of the output terminals 106n and a ground terminal, and the seventh capacitor C7 is provided between the other output terminal 106p and a ground terminal. Preferably, the capacitance values of the sixth capacitor C6 and the seventh capacitor C7 are set so that the output signals OUTn and OUTp are not be attenuated and that the second signal pair that leaks to the output terminals 106n and 106p is attenuated.

The eighth capacitor C8 is provided between the two output terminals 106n and 106p. Preferably, the capacitance value of the eighth capacitor C8 is also set so that the output signals OUTn and OUTp are not be attenuated and that the second signal pair that leaks to the output terminals 106n and 106p is attenuated.

The signal level of the first signal S1 is set to be small so as not to affect the operating point of the first transistor M1 through the fourth transistor M4, and signals that are in reverse phase to each other are applied as the second signals S2n and S2p. The signal level of the second signals S2n and S2p is set to be large enough so that the first transistor M1 through the fourth transistor M4 can switch with one another.

The advantages of the mixer circuit 100 having the configuration described thus far is described in the following.

Figure 2B:
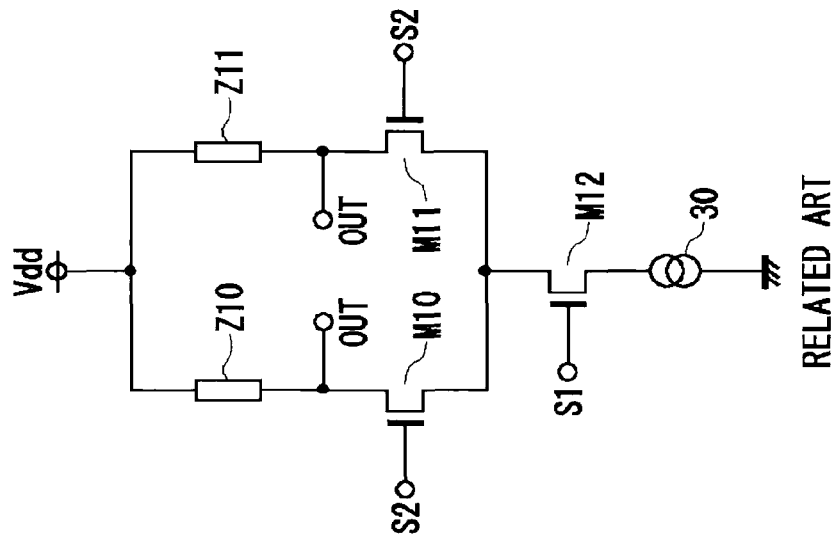
FIGS. 2A and 2B are circuit diagrams showing the configurations of general mixer circuits to be compared with the mixer circuit in FIG. 1.
Figure 2A:
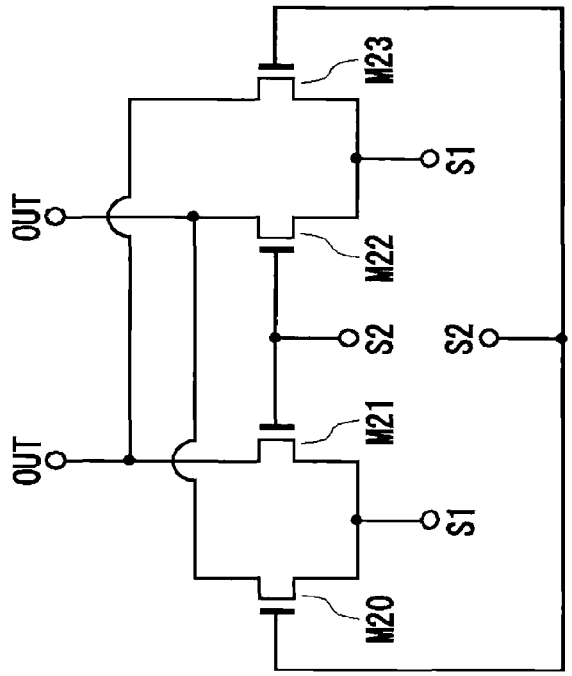

FIGS. 2A and 2B are circuit diagrams showing the configurations of general mixer circuits to be compared with the mixer circuit 100 in FIG. 1. FIG. 2A shows a Gilbert-cell type single-balanced mixer, and FIG. 2B shows a passive type double-balanced mixer.

In the mixer circuit in FIG. 2A, for example, a voltage of about 1.8V is required as the power supply voltage Vdd when there are voltage drops of 0.3V across a constant current source 30, 0.2V across a transistor M12, 0.3V across a transistor M10, and 1V across an impedance element Z10.

On the other hand, in the mixer circuit 100 according to the embodiment in FIG. 1, the fifth impedance element Z5 (sixth impedance element Z6), the first transistor M1-the fourth transistor M4, and the fifth capacitor C5 are connected between the third bias voltage Vb3 and the first input terminal 102. Therefore, since transistors are not stacked in the path from the power supply voltage Vdd to a ground voltage 0V as FIG. 2A, the mixer circuit is operable with a low-voltage power supply. As described above, the mixer circuit 100 is operable even when the third bias voltage Vb3 is about 1.1V. When the threshold voltage of the transistor is low, it is operable at a lower voltage.

In the circuit in FIG. 2A, the DC electric current generated by the constant current source 30 constantly flows into transistors M10 and M11, increasing the consumption current in the circuit.

On the other hand, in the mixer circuit 100 in FIG. 1, very little DC current constantly flows into the first transistor M1 through the fourth transistor M4, reducing the consumption current. Lowering the power consumption of a circuit is important particularly in battery-driven devices such as mobile phone terminals.

Furthermore, in the circuit of FIG. 1, the DC bias current does not flow between the drains and sources of the first transistor M1 through the fourth transistor M4, reducing the low-frequency flicker noise (1/f noise) obtained by a formula (1). In particular, if the frequency of the output signal OUT of the mixer circuit 100 falls in a low-frequency band, S/N ratio can be improved by the reduction of the flicker noise.

$$(V_{n,1/f})^2 = K_f I_{ds}^{Af}/(C_{ox}L^2)/f^{Ef} \qquad (1)$$

$K_f$: constant that depends on the process
Af, Ef: model parameter
$I_{ds}$: drain-source current
$C_{ox}$: gate oxide film capacity
L: channel length
f: frequency The circuit in FIG. 2A has a problem where the gate-source and gate-drain parasitic capacitance of the transistors M10 and M11 generate feed-through where the second signal pair S2 leaks to the output OUT, failing to secure the isolation.

On the other hand, in the mixer circuit 100 in FIG. 1, the N-channel MOSFET and the P-channel MOSFET are connected in a complementary style. A feed-through component caused by the first transistor M1, which is an N-channel MOSFET, and a feed-through component caused by the second transistor M2, which is a P-channel MOSFET, are in reverse phase with each other; thus, they can be cancelled out by each other. Similarly, a feed-through component caused by the third transistor M3 and a feed-through component caused by the fourth transistor M4 can be cancelled out by each other. As a result, the isolation between the second signals S2n and S2p and the output signals OUTn and OUTp can be improved.

In the perspective of the isolation improvement, the sizes of the second transistor M2 and the fourth transistor M4, which are P-channel MOSFETs, are set preferably so that the feed-throughs of the first transistor M1 and the fourth transistor M4, which are N-channel MOSFETs, can be cancelled out by each other. Also the second bias voltage Vb2 for the second transistor M2 and the fourth transistor M4 is set preferably so that their feed-throughs can be cancelled out by each other.

The mixer circuit 100 in FIG. 1 has the following advantage in comparison with the circuit in FIG. 2B.

Taking particular note of a voltage conversion gain, the mixer circuit 100 in FIG. 1 has twice the gain of the double-balanced mixer of the circuit in FIG. 2B. This means that even when the second signal pair S2 is small, the output signal OUT having a large amplitude can be obtained and is therefore advantageous.

While the circuit in FIG. 2B is constituted only by N-channel MOSFETs, the mixer circuit 100 in FIG. 1 uses N-channel and P-channel MOSFETs in combination. Compared to an N-channel MOSFET, a P-channel MOSFET generally generates less noise, and therefore the overall noise of the mixer circuit 100 can be suppressed.

Furthermore, since the constant Kf of the formula (I) for the estimation of flicker noise is smaller for a P-channel MOSFET, the flicker noise can be reduced.

The reduction of noise can give a circuit sufficient properties even when constituted by a silicon CMOS process, and therefore the manufacturing cost for a circuit including the mixer circuit 100 can be lowered.

The mixer circuit 100 in FIG. 1 can be used for a mobile phone terminal, a wireless communication device such as a wireless LAN, or a wire communication device. Examples of its application are a frequency converter, a quadrature modulator, and a quadrature demodulator. In particular, the mixer circuit 100 in FIG. 1 is operable under low voltage and has an effect of reducing power consumption. Thus, it can be preferably applied to a battery-driven terminal.

Figure 3:
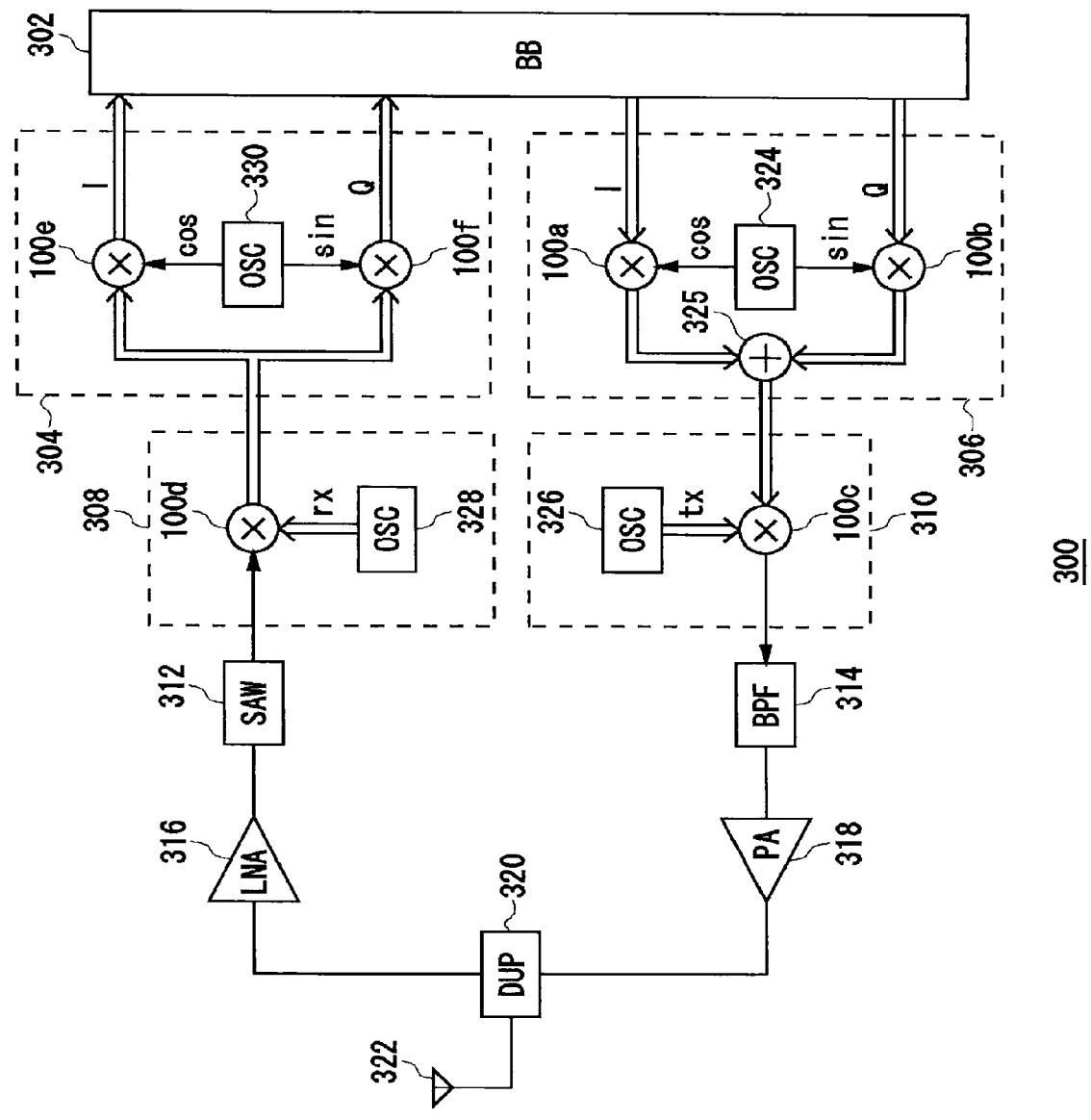
FIG. 3 is a block diagram showing the configuration of an electronic apparatus (communication apparatus) using the mixer circuit in FIG. 1.

FIG. 3 is a block diagram showing the configuration of an electronic apparatus (communication apparatus) using the mixer circuit 100 in FIG. 1. The electronic apparatus is a mobile phone terminal having a W-CDMA (Wideband-Code Division Multiple Access) format. A wireless LAN transceiver such as a mobile phone terminal using, for example, narrowband CDMA, PDC (Personal Digital Cellular), or GSM (Global System for Mobile Communications) also has a similar configuration in each of a frequency converter, a quadrature modulator, and a quadrature demodulator.

A mobile phone terminal 300 includes a baseband IC 302, a quadrature modulator 603, a converter 308 and a up-converter 310, which are frequency converters, a band-pass filter (saw filter) 312, a band-pass filter 314, a low noise amplifier (LNA) 316, a power amplifier (PA) 318, a duplexer 320, and an antenna 322.

A detailed description is now given from a transmitter's perspective. The baseband IC 302 generates an in-phase signal I and a quadrature signal Q and then outputs them to the quadrature modulator 306. The in-phase signal I and the quadrature signal Q are output as differential signals. The quadrature modulator 306 includes two mixer circuits 100a and 100b and an oscillator 324. The mixer circuits 100a and 100b are the mixer circuits 100 in FIG. 1. The oscillator 324 outputs a cosine signal cos and a sine signal sin, which have predetermined frequencies. The mixer circuit 100a receives the cosine signal cos at the first input terminal 102. The mixer circuit 100a receives complementary differential components of the in-phase signal I at the second input terminal 104n and at the second input terminal 104p. As a result, the in-phase signals I whose frequencies are converted are output from the output terminals 106n and 106p of the mixer circuit 100a. The mixer circuit 100b performs a similar process on the quadrature signal Q. An adder 325 adds and synthesizes output signals of the mixer circuits 100a and 100b. A quadrature modulated signal is output from the quadrature modulator 306. Described above is the configuration and the operation of the quadrature modulator 306.

The up-converter 310 includes an oscillator 326 and a mixer circuit 100c. The mixer circuit 100c is the mixer circuit 100 in FIG. 1. The oscillator 326 generates a carrier tx having a transmission frequency of about 2 GHz. The mixer circuit 100c receives the carrier tx at the first input terminal 102 and receives differential signals from the quadrature modulator 306 at the second input terminals 104n and 104p. A signal, which is converted to have a transmission frequency by the up-converter 310, is generated.

The band-pass filter 314 removes an unnecessary band frequency of the up-converter 310, and the PA 318 amplifies the output of the band-pass filter 314. The output of the band-pass filter 314 is transmitted from the antenna 322 via the duplexer 320.

A detailed description is now given from a receiver's perspective. The signal received by the antenna 322 is input to the LNA 316 via the duplexer 320. The LNA 316 amplifies the reception signal, and the band-pass filter 312 removes any unnecessary band frequency.

The down-converter 308 includes an oscillator 328 and a mixer circuit 100d. The oscillator 328 generates a differential signal rx having a reception frequency. The mixer circuit 100d receives the output signal of the band-pass filter 312 at the first input terminal 102 and receives the differential signal rx from the oscillator at the second input terminals 104n and 104p. The mixer circuit 100d converts, by direct conversion, the frequency of a reception signal close to the DC component.

The quadrature demodulator 304 includes mixer circuits 100e and 100f and an oscillator 330. The oscillator 330 generates the cosine signal cos and the sine signal sin, which have predetermined frequencies. The mixer circuit 100e receives the cosine signal cos at the first input terminal 102 and receives a modulated reception signal from the down-converter 308 at the second input terminals 104n and 104p. The mixer circuit 100e extracts only the in-phase signals I by mixing the reception signal and the cosine signal cos and outputs it to the baseband IC 302. The mixer circuit 100f performs a similar process on the sine signal sin. The reception signal is divided into an I component and a Q component by the quadrature demodulator 304.

As described, the mixer circuit 100 in FIG. 1 can be used for the mobile phone terminal 300 and other communication devices.

While the preferred embodiments of the present invention have been described using specific terms, such description is for illustrative purposes only, and it is to be understood that changes and variations may be made without departing from the spirit or scope of the appended claims.

The invention claimed is:

1. A mixer circuit that, upon the receipt of a single-ended first signal input to a first input terminal and a second signal pair input differentially to two second input terminals, multiplies the first signal and the second signal pair and then outputs differentially from two output terminals, comprising:

an N-channel first MOSFET (Metal Oxide Semiconductor Field Effect Transistor) and a P-channel second MOSFET where their first terminals are connected to each other and their second terminals are connected to each other;

an N-channel third MOSFET and a P-channel fourth MOSFET where their first terminals are connected to each other and their second terminals are connected to each other;

a first capacitor provided between a gate of the first MOSFET and one of the second input terminals;

a second capacitor provided between a gate of the second MOSFET and the other one of the second input terminals;

a third capacitor provided between a gate of the third MOSFET and the other one of the second input terminals;

a fourth capacitor provided between a gate of the fourth MOSFET and said one of the second input terminals;

a first impedance element, whose one end is connected to the gate of the first MOSFET, that receives a first voltage at the other end;

a second impedance element, whose one end is connected to the gate of the second MOSFET, that receives a second voltage at the other end;

a third impedance element, whose one end is connected to the gate of the third MOSFET, that receives a first voltage at the other end;

a fourth impedance element, whose one end is connected to the gate of the fourth MOSFET, that receives a second voltage at the other end;

a fifth capacitor provided between the first terminals of the first, second, third, and fourth MOSFETs and the first input terminal;

a fifth impedance element, whose one end is connected to the second terminals of the first and second MOSFETs, that receives a third voltage at the other end; and a sixth impedance element, whose one end is connected to the second terminals of the third and fourth MOSFETs, that receives a third voltage at the other end, wherein the second terminals of the first and second MOSFETs are connected to one of the output terminals and the second terminals of the third and fourth MOSFETs are connected to the other one of the output terminals.

2. The mixer circuit according to claim 1 further comprising:

a sixth capacitor provided between one of the output terminal and a ground terminal; and a seventh capacitor provided between the other one of the output terminal and a ground terminal.

3. The mixer circuit according to claim 1 further comprising an eighth capacitor provided between the two output terminals.

4. An electronic apparatus provided with a frequency converter that generates a sum-frequency signal or a difference-frequency signal of a first signal with a first frequency and a second signal pair with a second frequency, comprising the mixer circuit according to claim 1 that mixes the first signal and the second signal pair.

* * * * *